(12) United States Patent
Yendler et al.

(10) Patent No.: US 7,846,254 B2
(45) Date of Patent: Dec. 7, 2010

(54) HEAT TRANSFER ASSEMBLY

(75) Inventors: Boris S. Yendler, Saratoga, CA (US); Alexander Matyushkin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1155 days.

(21) Appl. No.: 10/440,365

(22) Filed: May 16, 2003

(65) Prior Publication Data

US 2004/0226515 A1   Nov. 18, 2004

(51) Int. Cl.
*C23C 16/00* (2006.01)
*C23F 1/00* (2006.01)
*H01L 21/306* (2006.01)

(52) U.S. Cl. .................... 118/725; 156/345.52

(58) Field of Classification Search .............. 118/725, 118/728; 279/128; 361/234
See application file for complete search history.

(56) References Cited

U.S. PATENT DOCUMENTS

| | | | | |
|---|---|---|---|---|
| 5,155,652 A | * | 10/1992 | Logan et al. | 361/234 |
| 5,675,471 A | * | 10/1997 | Kotecki | 361/234 |
| 5,796,074 A | | 8/1998 | Edelstein et al. | 219/390 |
| 5,968,273 A | * | 10/1999 | Kadomura et al. | 118/715 |
| 5,978,202 A | * | 11/1999 | Wadensweiler et al. | 361/234 |
| 6,081,414 A | * | 6/2000 | Flanigan et al. | 361/234 |
| 6,129,046 A | | 10/2000 | Mizuno et al. | 118/725 |
| 6,159,299 A | | 12/2000 | Koai et al. | 118/715 |
| 6,166,897 A | * | 12/2000 | Matsunaga | 361/234 |
| 6,174,377 B1 | | 1/2001 | Doering et al. | 118/729 |
| 6,292,346 B1 | * | 9/2001 | Ohno et al. | 361/234 |
| 6,310,755 B1 | * | 10/2001 | Kholodenko et al. | 361/234 |
| 6,472,643 B1 | * | 10/2002 | Babikian | 219/444.1 |
| 6,705,394 B1 | * | 3/2004 | Moslehi et al. | 165/206 |
| 2003/0198005 A1 | * | 10/2003 | Sago et al. | 361/234 |

FOREIGN PATENT DOCUMENTS

| | | |
|---|---|---|
| JP | 11-193868 | 7/1999 |
| JP | 11-265931 | 9/1999 |
| JP | 2001-237222 | 8/2001 |
| JP | 2002-170868 | 6/2002 |

OTHER PUBLICATIONS

"Member." The American Heritage® Dictionary of the English Language, Fourth Edition. Houghton Mifflin Company, 2004. Aug. 1, 2008. <Dictionary.com http://dictionary.reference.com/browse/member>.*

* cited by examiner

Primary Examiner—Parviz Hassanzadeh
Assistant Examiner—Maureen Gramaglia
(74) Attorney, Agent, or Firm—Alan Taboada; Moser IP Law Group

(57) ABSTRACT

A heat transfer assembly having a heat spreading member sandwiched between a heat source and a heat sink is disclosed. The heat sink, the heat spreading member, and the heat source are pressed against the bottom of a substrate support plate by a bias member.

30 Claims, 3 Drawing Sheets

HEAT TRANSFER ASSEMBLY

BACKGROUND OF THE INVENTION

1. Field of the Invention

The present invention generally relates to semiconductor substrate processing systems. More specifically, the invention relates to an apparatus for supporting a substrate in a semiconductor substrate processing system.

2. Description of the Related Art

Accurate reproducibility of substrate processing is an important factor when increasing productivity for integrated circuit fabrication processes. Precise control of various process parameters is required for achieving consistent results across a substrate, as well as results that are reproducible from substrate to substrate. More particularly, uniformity of the substrate temperature during processing is one requirement for achieving accurate reproducibility. During substrate processing, changes in the temperature and temperature gradients across the substrate are detrimental to material deposition, etch rate, step coverage, feature taper angles, and the like.

Generally, during processing, the substrate is disposed on a substrate support (e.g., electrostatic chuck, susceptor, and the like) that is thermally coupled to a heat source, such as an embedded heater, e.g., a resistive heater and the like. Additionally, in some applications, heat is also produced by the process itself (e.g., plasma process). To enhance the processing and minimize undesirable yield losses, it is essential to control the temperature as well as the temperature uniformity of the substrate.

Therefore, there is a need in the art for a substrate support having means to control the temperature as well as the temperature uniformity of the substrate.

SUMMARY OF THE INVENTION

The disadvantages associated with the prior art are overcome by an improved substrate support for a semiconductor substrate processing system. The substrate support comprises a heat transfer assembly having a heat spreader member that is sandwiched between a heat source and a heat sink. The heat sink, heat spreader member, and heat source are pressed against the bottom of a substrate support plate by a bias member.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a heat transfer assembly for controlling the temperature and temperature uniformity of a substrate support in a substrate processing system. The substrate support is generally used to support a substrate (e.g., silicon (Si) wafer) in a process chamber of the substrate processing system, such as a plasma etching reactor, a reactive ion etching (RIE) reactor, a chemical vapor deposition (CVD) reactor, a plasma enhanced CVD (PECVD) reactor, a physical vapor deposition (PVD) reactor, an electron cyclotron resonance (ECR) reactor, a rapid thermal processing (RTP) reactor, an ion implantation system, and the like. The invention is useful in applications that require a substrate to be supported in a chamber while the temperature of the substrate is required to be substantially uniform.

Figure 1:
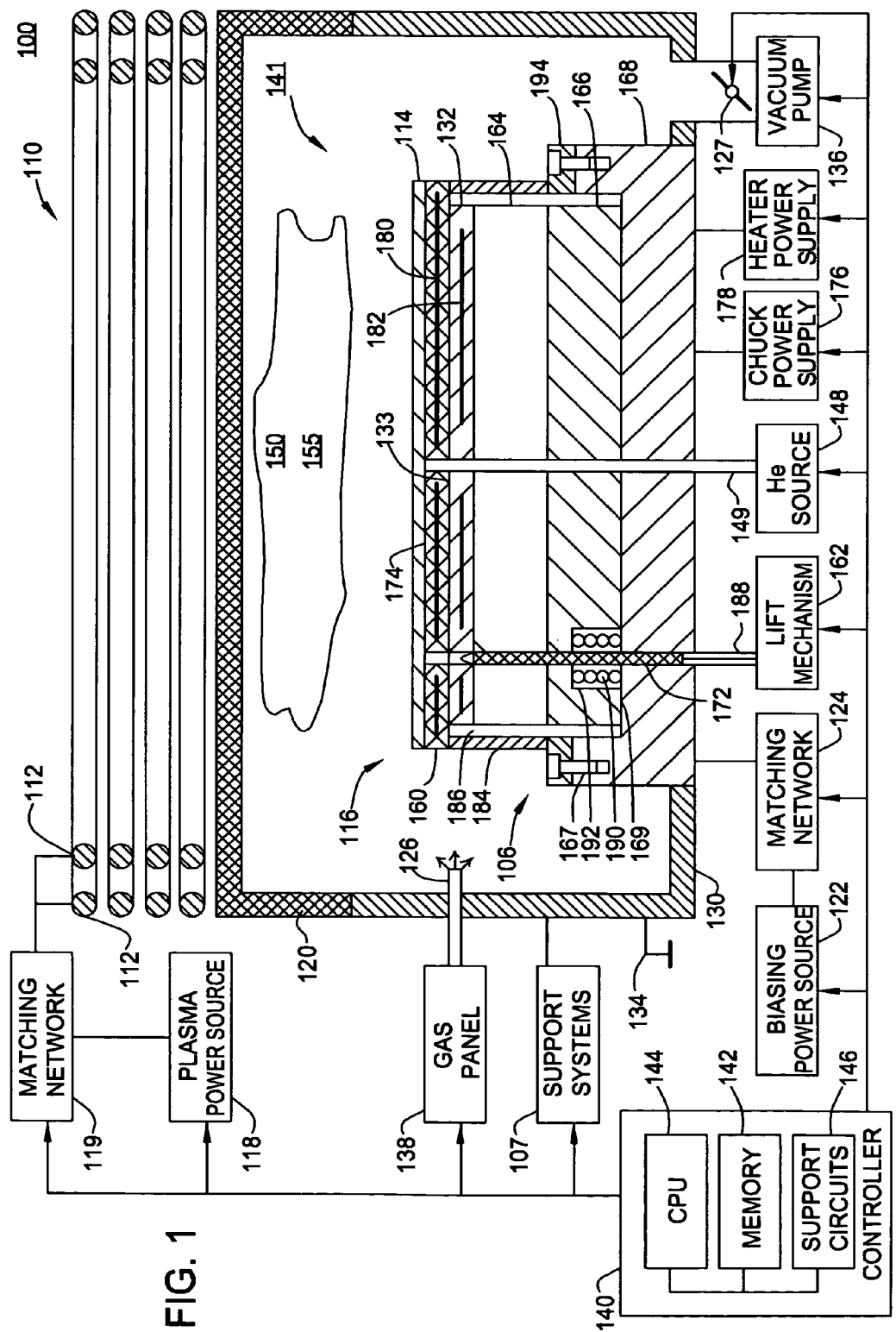
FIG. 1 depicts a schematic diagram of an exemplary processing reactor comprising a substrate support in accordance with one embodiment of the present invention.

FIG. 1 depicts a schematic diagram of an exemplary Decoupled Plasma Source (DPS II) etch reactor 100 that may be used to practice the invention. The DPS II reactor is commercially available from Applied Materials, Inc. of Santa Clara, Calif. The particular embodiment of the reactor 100 shown herein is provided for illustrative purposes and should not be used to limit the scope of the invention. For example, the invention can be used in apparatus other than a system for processing substrates, whether fabricated of semiconductor materials or other materials.

The reactor 100 comprises a process chamber 110 and a controller 140.

The process chamber 110 generally comprises a conductive body (wall) 130 having a substantially flat dielectric ceiling 120 and encompassing a substrate support 116. The process chamber 110 may have other types of ceilings, e.g., a dome-shaped ceiling. The wall 130 typically is coupled to an electrical ground terminal 134.

Above the ceiling 120 is disposed an antenna comprising at least one inductive coil element 112 (two co-axial elements 112 are shown). The inductive coil element 112 is coupled, through a first matching network 119, to a plasma power source 118. The plasma power source 118 generally is capable of producing up to 5000 W at a tunable frequency in a range from about 50 kHz to 13.6 MHz. The matching network 119 and the plasma power source 118 are controlled by the controller 140.

The support pedestal 116 is coupled, through a second matching network 124, to a biasing power source 122. The biasing power source 122 generally is a source of up to 2000 W of continuous or pulsed power at a frequency of approximately 13.6 MHz. In other embodiments, the biasing power source 122 may be a DC or pulsed DC power source. The biasing power source 122 and the matching network 124 are controlled by the controller 140.

During processing, a substrate 114 is placed on the support pedestal 116 and thereafter process gases are supplied from a gas panel 138 through at least one entry port 126 to form a gaseous mixture 150 in the process chamber 110. Operation of the gas panel 138 is controlled by the controller 140. The gaseous mixture 150 is ignited to a plasma 155 in the process chamber 110 by applying power from the plasma source 118 to the at least one inductive coil element 112, while the substrate 114 may be also biased by applying power from the biasing source 122 to the substrate support 116.

The lift mechanism 162, as controlled by the controller 140, is used to raise the substrate 114 off the substrate support 116 or to lower the substrate onto the substrate support. Generally, the lift mechanism 162 comprises an actuator that engages a lift plate (both are not shown) coupled to a plurality of lift pins 172 (one lift pin is illustratively shown in FIG. 1).

The lift pins 172 travel through respective guide holes 188. Illustratively, the guide holes 188 are defined by an inner passage of tubes 206 that are supported by bushings 208 (discussed in reference to FIG. 2).

In one embodiment, the guide holes 188 are equidistantly distributed along a circle 310 (shown in phantom in FIG. 3) that is concentric with the substrate support 116. Such lift mechanism is disclosed in commonly assigned U.S. patent application Ser. No. 10/241,005, filed Sep. 10, 2002 (7262), which is incorporated herein by reference.

Gas pressure within the interior of the chamber 110 is controlled by the controller 140 using a throttle valve 127 and a vacuum pump 136. The temperature of the wall 130 may further be controlled using liquid-containing conduits (not shown) running through the wall. The process chamber 110 also comprises conventional systems for process control, including, for example, internal process diagnostics, and the like. Such systems are collectively depicted in FIG. 1 as support systems 107.

To facilitate control of the components and substrate processing within the chamber 110, the controller 140 may be one of any form of general-purpose computer processor that can be used in an industrial setting for controlling various chambers and sub-processors. The controller 140 generally comprises a central processing unit (CPU) 144, a memory 142, and support circuits 146 for the CPU 144.

Those skilled in the art will understand that other forms of process chambers may be used to practice the invention, such as electron cyclotron resonance (ECR) chambers, chemical vapor deposition (CVD) chambers, plasma enhanced CVD (PECVD) chambers, physical vapor deposition (PVD) chambers, rapid thermal processing (RTP) chambers, and any other chamber that may incorporate a substrate support having an embedded heater therein.

In one depicted embodiment, the support pedestal 116 comprises a substrate support plate 160, a heat source (such as an embedded heater) 132, a heat transfer assembly 164, a heat sink (such as a cooling plate) 166, at least one bias member 190, and a mounting assembly 106. In alternative embodiments, the substrate support plate 160 may comprise an electrostatic chuck (as shown) or another substrate retention mechanism, e.g., a mechanical chuck, a susceptor clamp ring, vacuum chuck, and the like.

In operation, the substrate 114 generally should be heated to a pre-selected temperature (e.g., from about 0 to 500 degrees Celsius). The substrate 114 is heated with minimal non-uniformity across the substrate and then maintained at such temperature. The temperature of the substrate 114 is controlled by stabilizing the temperature of the support pedestal 116 using an embedded heater 132 and a heat transfer gas (e.g., helium (He)). The embedded heater 132 is used to heat the support pedestal 116 while the heat transfer gas cools down the substrate 114. Generally, helium is provided to the underside of the substrate 114 from a source 148 through a gas conduit 149 to channels and grooves (not shown) formed in a top surface 174 of the substrate support plate 160.

In one embodiment of the substrate support plate 160, an electrostatic chuck comprises at least one clamping electrode 180 that may be conventionally controlled by a chuck power supply 176. The embedded heater 132 (e.g., resistive electric heater) comprises at least one heating element 182 and is regulated by a heater power supply 178.

In one embodiment, the embedded heater 132 is a detachable heater that is thermally coupled to a bottom surface 133 of the substrate support plate 160. The at least one bias member 190 applies force to the heater 132 to press it against the bottom surface 133 of the substrate support plate 160. In an alternative embodiment, the heater 132 may be embedded in the substrate support plate (e.g., electrostatic chuck) 160 or be bonded to the bottom surface 133 of the substrate support plate 160.

The substrate support plate 160 and embedded heater 132 are generally formed from dielectric materials having a high thermal conductivity (e.g., aluminum nitride (AlN) and the like), as well as low coefficients of thermal expansion. The coefficients of thermal expansion for each of the substrate support plate 160 and the heater 132 should be matched. The high thermal conductivity increases thermal coupling between the substrate support plate 160 and the heater 132 to facilitate uniform temperatures for the support surface 174 of the plate 160 and a substrate 114 thereon. The matching low coefficients of thermal expansion reduce the expansion/contraction of the substrate support plate 160 relative to the heater 132 across a broad range of temperatures (e.g., from about 0 to 500 degrees Celsius).

The heat transfer assembly 164 facilitates a controlled heat sink path to the cooling plate 166, for heat generated by the embedded heater 132, as well as for heat produced during substrate processing, e.g., plasma processing. By regulating the total and local thermal conductivity of the heat transfer assembly 164, temperature uniformity for the substrate support 116 may be achieved.

The heat transfer assembly 164 is used to selectively optimize over a broad range of temperatures and process parameters the thermal properties (i.e., temperature uniformity and maximum temperature) of the substrate support 116. In one embodiment, the heat transfer assembly 164 comprises an electrostatic chuck and embedded heater. The electrostatic chuck and embedded heater may each be of a variety of design configurations. Specifically, the heat transfer assembly 164 may be used to selectively optimize the thermal properties of a substrate support 116 having a detachable embedded heater, e.g., resistive electric heater.

The cooling plate 166 is thermally coupled to the heat transfer assembly 164 and generally, is formed from a metal, such as aluminum (Al), copper (Cu), stainless steel, and the like.

In the depicted embodiment, the cooling plate 166 comprises a plurality of recesses 192, e.g., blind holes, grooves, and the like. Each recess 192 houses a bias member 190, including at least one cylindrical spring and the like. The bias member 190 exerts an expanding elastic force. Such force engages the substrate support plate 160, embedded heater 132, heat transfer assembly 164, and cooling plate 166 against one another and facilitates thermal coupling between the components of the substrate support 116.

The bias members 190 are disposed such that the substrate support plate 160, embedded heater 132, heat transfer assembly 164, and cooling plate 166 are uniformly compressed against one another to provide thermal coupling between the components. In one exemplary embodiment, the bias members 190 are disposed along at least one circle that is concentric with the substrate support 116, e.g., around the lift pins 172. Alternatively, the bias members 190 may be similarly disposed in recesses that are formed in a surface 169 of the base plate 168, or both in the cooling plate 166 and base plate 168.

The mounting assembly 106 generally comprises a base plate (or ring) 168, a collar ring 184, a flange 194, and a plurality of fasteners (e.g., screws, bolts, clamps, and the like) 167. The fasteners 167 couple the flange 194, cooling plate 166 and base plate 168 together to provide mechanical integrity for the substrate support 116. In further embodiments (not shown), the support pedestal 116 may also include various process-specific improvements, e.g., a purge gas ring, lift bellows, substrate shields, and the like.

In one embodiment, the collar ring 184 is formed from KOVAR (i.e., an alloy comprising, by weight, about 54% iron (Fe), 29% nickel (Ni), and 17% cobalt (Co)). Further, the collar ring 184 is brazed to the substrate support plate 160 and flange 162 to facilitate gas-tight coupling between the support plate and flange. KOVAR has a low coefficient of thermal expansion and a low thermal conductivity and is known in the art for forming strong brazed bonds with materials, such as ceramics (support plate 160) and metals (flange 194). KOVAR is commercially available from EFI of Los Alamitos, Calif., and other suppliers.

The mounting assembly 106 encompasses an interior region 186 of the substrate support 116. In operation, the interior region 186 generally is maintained at a gas pressure that is higher than the gas pressure in a reaction volume 141. Such higher gas pressure (e.g., atmospheric pressure) prevents radio-frequency arcing within the support pedestal 116 that otherwise is promoted by the biasing power source 122.

Figure 2:
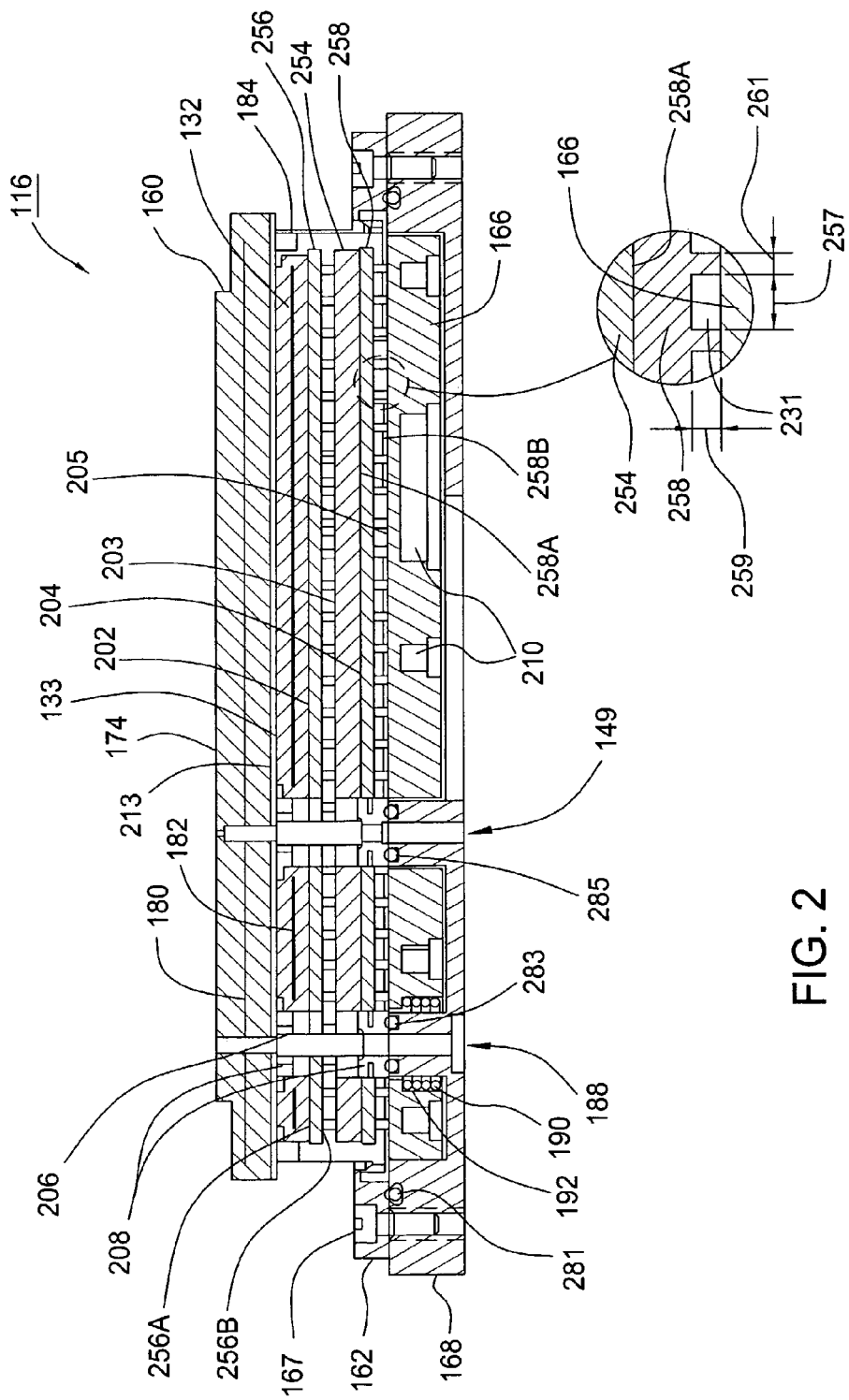
FIG. 2 is a schematic, cross-sectional view of a heat transfer assembly of the substrate support of FIG. 1 in accordance with one embodiment of the present invention.
Figure 3:
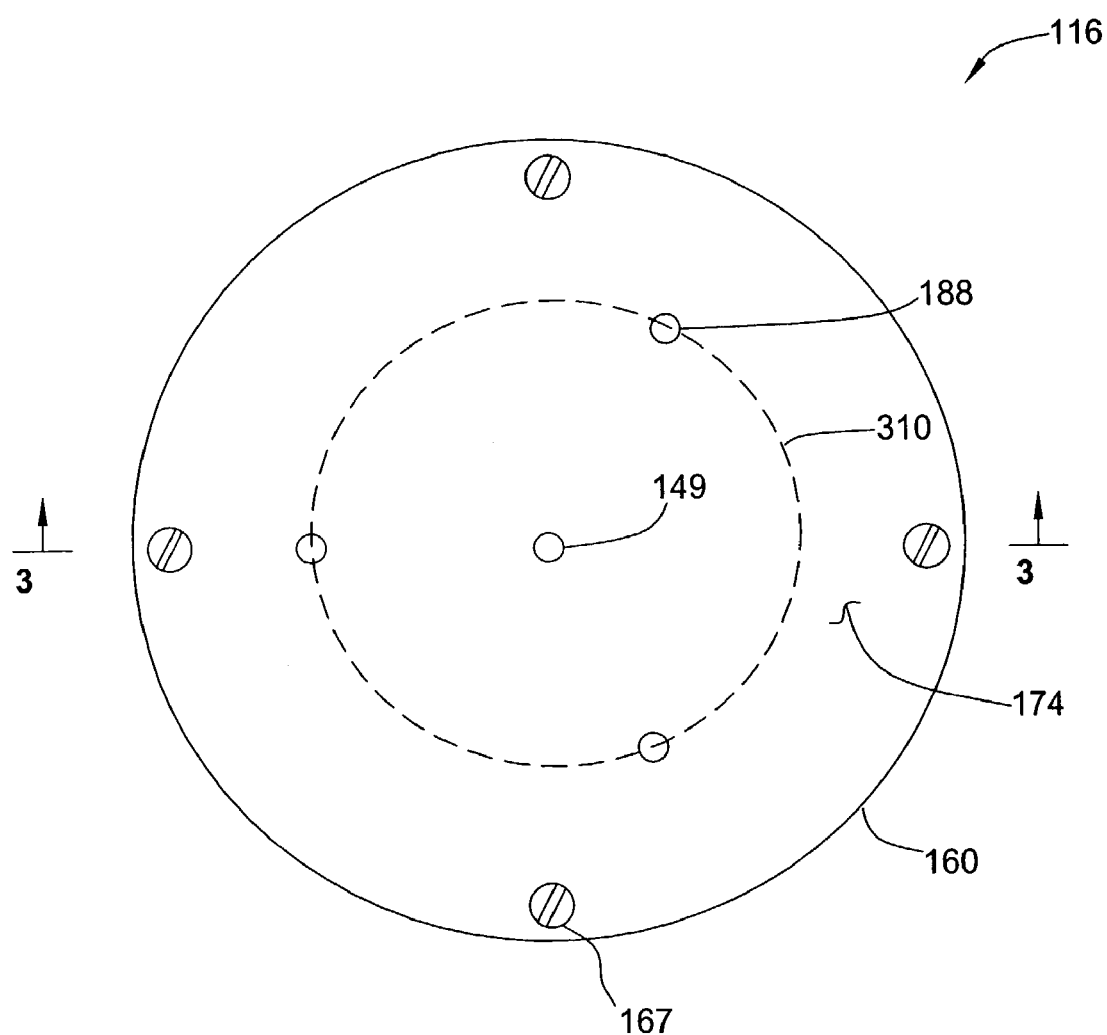
FIG. 3 is a schematic, top plan view of the heat transfer assembly of FIG. 2.

FIG. 2 and FIG. 3 are, respectively, schematic, cross-sectional and top plan views of a heat transfer assembly 164 of a substrate support 116 of the reactor 100. The cross-sectional view in FIG. 2 is taken along a centerline 3-3 in FIG. 3.

Referring to FIGS. 2 and 3, in one illustrative embodiment, the heat transfer assembly 164 comprises a heat spreader plate 254 that is sandwiched between a first contact plate 256 and a second contact plate 258. Alternatively, the heat transfer assembly 164 may comprise a single composite sandwich-like member. Additionally, the embedded heater 132 may be included in the heat transfer assembly 164.

The first and second contact plates 256, 258 are used to reduce, in a controlled manner, heat flux from the embedded heater 132 through the heat transfer assembly 164 to the cooling plate 166. The cooling plate 166 comprises conduits 210 that facilitate coolant flow to remove heat from the cooling plate 166. The contact plates 256, 258 may be formed from materials having a low thermal conductivity, e.g., KOVAR, titanium (Ti), and the like. Generally, the contact plates 256, 258 have a thickness of about 3 to 12 mm.

The first contact plate 256 has a flat (i.e., smooth) first contact surface 256A and an embossed second contact surface 256B. Similarly, the second contact plate 258 has a smooth first contact surface 258A and an embossed second contact surface 258B. The smooth first contact surfaces 256A, 258A engage a bottom surface 202 of the embedded heater 132 and a bottom surface 204 of the heat spreader plate 254, respectively. Accordingly, the embossed second contact surface 256B engages a top surface 203 of the heat spreader plate 254, while the embossed second contact surface 256B engages a top surface 205 of the cooling plate 166.

A surface area of the embossed second contact surfaces 256B, 258B generally comprises about 5 to 50% of the surface area of the smooth first contact surfaces 256A, 258A, respectively. The second contact surfaces 256B, 258B may be embossed using conventional machining techniques, such as milling, turning, and the like.

Contact plates with a smaller embossed surface area provide a corresponding lower thermal conductivity in the direction that is orthogonal to the smooth contact surfaces. This means that contact plates 256, 258 having a smaller embossed surface area will reduce the heat flux from the embedded heater 132 at a slower rate then contact plates having a larger embossed surface area. In one exemplary embodiment, the surface area of the embossed contact surfaces 256B, 258B comprise about 20% of the surface area of the respective first contact surfaces 256A, 258A.

Further, a local pattern density for the embossed surfaces 256B, 258B (i.e., surface area in a specific region of contact surface 256B or 258B) may be selected such that a contact plate has a pre-determined local thermal conductivity. The pre-determined local thermal conductivity in one region of a contact plate may be higher or lower than the thermal conductivity in other regions of the plate. Such contact plates may be used to control the flux of heat in specific regions of the heat transfer assembly 164 to improve temperature uniformity across the substrate support plate 160 as well as the substrate 114.

The heat spreader plate 254 reduces temperature non-uniformity caused by features formed in the substrate support 116 (e.g., guide holes 188, gas conduit 149, the embossed surfaces 256B, 258B of the contact plates 256, 258, and the like). Generally, the heat spreader plate 254 is formed to a thickness of about 3 to 12 mm of a material having a high thermal conductivity (e.g., aluminum nitride (AlN), copper (Cu), and the like).

The thermal conductivity of the heat transfer assembly 164 may be selectively controlled by choosing the materials and thickness for the heat spreader plate 254 and contact plates 256, 258, as well as a pattern and pattern density of the embossed contact surfaces 256B, 258B.

In one illustrative embodiment shown in FIG. 2, the embossed contact surfaces 256B, 258B comprise a plurality of grooves 231 that are concentric with the substrate support 116. Each groove has a width 257 and depth 259 of about 4 and 3 mm, respectively, and the grooves are separated from one another by a wall having a thickness 261 of about 3 mm.

In alternative embodiments, the embossed contact surfaces 256B, 258B each may comprise a plurality of parallel grooves, orthogonal grooves, grooves separated by walls having different thicknesses, and the like. To reduce temperature non-uniformity across the substrate, the embossments generally have a higher pattern density in areas that oppose hotter zones of the substrate support plate 160, the embedded heater 132, or the substrate 114.

Thermally conductive sheets 213 may be placed between one or more surfaces of the components comprising the substrate support 116. In one embodiment, the thermally conductive sheets 213 are placed between the bottom surface 133 of the substrate support plate 160 and the embedded heater 132 (shown in FIG. 2), the bottom surface 202 of the embedded heater 132 and the top surface 256A of the first contact plate 256 (not shown), the embossed surface 256B of the first contact plate 256 and the top surface 203 of the heat spreader plate 254 (not shown), the bottom surface 204 of the heat spreader plate 254 and the top surface 258A of the second contact plate 258 (not shown), and the embossed surface 258B of the second contact plate and the top surface 205 of the cooling plate 166 (not shown). Each thermally conductive sheet 213 has cutouts that conform to the surfaces of the components they separate to allow passage of lift pins 172 as well as the gas conduit 149. The thermally conductive sheets 213 facilitate uniform heat transfer between the components comprising the substrate support 116, when such components are compressed by bias members 190.

The thermally conductive sheets 213 may comprise graphite (GRAFOIL® flexible graphite commercially available from UCAR International, Inc., Nashville, Tenn.), aluminum, and the like. The thickness of the thermally conductive sheets 213 should be within a range of about 1-5 micrometers.

The heat transfer assembly 164 described herein may also be used to improve the temperature uniformity of a substrate placed on a substrate support plate (e.g., electrostatic chuck)

having a detachable heater or, alternatively, a substrate support plate having an embedded heater.

To facilitate isolation of the interior region 186, the base plate 168 is supplied with gas-tight seals 281, 283, and 285. Together, the seals and collar ring 184 isolate the interior region 186 from the reaction volume 141 (seal 281), guide hole 188 (seal 283), and gas conduit 149 (seal 285). In the illustrative embodiment shown in FIG. 2, each such seal comprises an elastic member (e.g., O-rings and the like) that is disposed in a conventional manner in a circular groove.

Those skilled in the art will readily realize other permissible modifications of the substrate support 116 and heat transfer assembly 164 that facilitate advantageous in-situ control of the substrate temperature and temperature non-uniformity.

While foregoing is directed to the illustrative embodiment of the present invention, other and further embodiments of the invention may be devised without departing from the basic scope thereof, and the scope thereof is determined by the claims that follow.

What is claimed is:

1. A heat transfer assembly of a substrate support for a substrate processing system, comprising:
    a heat spreading member that is sandwiched between a lower surface of a first contact plate and an upper surface of a second contact plate, the first contact plate having a lower surface that is thermally coupled to an upper surface of the heat spreading member, the second contact plate having an upper surface that is thermally coupled to a lower surface of the heat spreading member along a predominant portion of the lower surface of the heat spreading member, the heat spreading member having a greater thermal conductivity than the first and second contact plates, wherein the first contact plate is thermally coupled to a heat source disposed above the lower surface of the first contact plate, the second contact plate is thermally coupled to a heat sink along a predominant portion of a bottom surface of the second contact plate, and wherein the first and second contact plates reduce heat flux between adjacent components.

2. The heat transfer assembly of claim 1 wherein the heat source is an embedded heater.

3. The heat transfer assembly of claim 2 wherein the embedded heater is a detachable heater that is thermally coupled to a substrate support plate of the substrate support.

4. The heat transfer assembly of claim 1 wherein the first and second contact plates each comprise one smooth contact surface and one embossed contact surface.

5. The heat transfer assembly of claim 4 wherein the embossed contact surface comprises an area that is about 5 to 50% of the surface area of the smooth contact surface.

6. The heat transfer assembly of claim 4 wherein embossment in a first region of the embossed contact surface differs from embossment in at least one other region of the embossed contact surface.

7. The heat transfer assembly of claim 1 wherein the heat spreading member is formed of a material selected from the group consisting of aluminum nitride (AlN) and copper (Cu).

8. The heat transfer assembly of claim 1 wherein the first and second contact plates are formed of a material selected from the group consisting of titanium (Ti) and an alloy comprising iron (Fe), nickel (Ni) and cobalt (Co).

9. The heat transfer assembly of claim 1 wherein one or more thermally conductive sheets thermally couple at least two or more members selected from the group consisting of the heat spreading member, the first contact plate, the second contact plate, the heat source, the heat sink and a substrate support plate.

10. The heat transfer assembly of claim 9 wherein the one or more thermally conductive sheets are formed of a material selected from the group consisting of graphite and aluminum.

11. The apparatus of claim 1, wherein the second contact plate is between about 3 and 12 mm thick.

12. The apparatus of claim 1, wherein the heat spreading member is between about 3 and 12 mm thick.

13. Apparatus for processing a semiconductor substrate, comprising:
    a process chamber; and
    a substrate support disposed in the process chamber comprising a heat spreading member that is sandwiched between a lower surface of a first contact plate and an upper surface of a second contact plate, the first contact plate having a lower surface that is thermally coupled to an upper surface of the heat spreading member, the second contact plate having an upper surface that is thermally coupled to a lower surface of the heat spreading member along a predominant portion of the lower surface of the heat spreading member, the heat spreading member having a greater thermal conductivity than the first and second contact plates, wherein the first contact plate is thermally coupled to a heat source disposed above the lower surface of the first contact plate, the second contact plate is thermally coupled to a heat sink along a predominant portion of a bottom surface of the second contact plate, and wherein the first and second contact plates reduce heat flux between adjacent components.

14. The apparatus of claim 13 wherein the heat source is an embedded heater.

15. The apparatus of claim 14 wherein the embedded heater is a detachable heater that is thermally coupled to a substrate support plate of the substrate support.

16. The apparatus of claim 13 wherein the first and second contact plates each comprise one smooth contact surface and one embossed contact surface.

17. The apparatus of claim 16 wherein the embossed contact surface comprises an area that is about 5 to 50% of the surface area of the smooth contact surface.

18. The apparatus of claim 16 wherein embossment in a first region of the embossed contact surface differs from embossment in at least one other region of the embossed contact surface.

19. The apparatus of claim 16 wherein the smooth contact surface of the first contact plate engages the heat source and the embossed contact surface of the first contact plate engages the heat spreading member.

20. The apparatus of claim 16 wherein the smooth contact surface of the second contact plate engages the heat spreading member and the embossed contact surface of the second contact plate engages the heat sink.

21. The apparatus of claim 13 wherein the heat spreading member is formed of a material selected from the group consisting of aluminum nitride (AlN) and copper (Cu).

22. The apparatus of claim 13 wherein the first and second contact plates are formed of a material selected from the group consisting of titanium (Ti) and an alloy comprising iron (Fe), nickel (Ni) and cobalt (Co).

23. The apparatus of claim 13 further comprising at least one bias member that engages and thermally couples a substrate support plate, the heat source, the heat transfer assembly and the heat sink.

24. The apparatus of claim 23 wherein each bias member exerts an expanding elastic force.

25. The apparatus of claim 23 wherein each bias member is disposed in the heat sink or a base member that is coupled to the heat sink.

26. The apparatus of claim 23 wherein each bias member comprises at least one cylindrical spring.

27. The apparatus of claim 13 wherein one or more thermally conductive sheets thermally couple at least two or more members selected from the group consisting of the heat spreading member, the first contact plate, the second contact plate, the heat source, the heat sink and a substrate support plate.

28. The apparatus of claim 27 wherein the one or more thermally conductive sheets are formed of a material selected from the group consisting of graphite and aluminum.

29. The apparatus of claim 13, wherein the second contact plate is between about 3 and 12 mm thick.

30. The apparatus of claim 13, wherein the heat spreading member is between about 3 and 12 mm thick.

* * * * *